United States Patent
Rim et al.

(10) Patent No.: US 10,020,048 B2
(45) Date of Patent: Jul. 10, 2018

(54) INTEGRATED CIRCUIT INCLUDING EMBEDDED MEMORY DEVICE FOR PERFORMING DUAL-TRANSIENT WORD LINE ASSIST USING TRIPLE POWER SOURCE AND DEVICE HAVING THE SAME

(71) Applicant: SAMSUNG ELECTRONICS CO., LTD., Suwon-si (KR)

(72) Inventors: Woojin Rim, Suwon-si (KR); Tae Joong Song, Seongnam-si (KR); Yong Ho Kim, Seoul (KR); Sung Hyun Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/361,599

(22) Filed: Nov. 28, 2016

(65) Prior Publication Data
US 2017/0194047 A1 Jul. 6, 2017

Related U.S. Application Data

(60) Provisional application No. 62/272,977, filed on Dec. 30, 2015.

(30) Foreign Application Priority Data

Apr. 5, 2016 (KR) .......................... 10-2016-0041388

(51) Int. Cl.
| | | |
|---|---|---|
| G11C 11/00 | (2006.01) | |
| G11C 11/419 | (2006.01) | |
| G11C 11/418 | (2006.01) | |
| G06F 1/32 | (2006.01) | |
| G11C 8/08 | (2006.01) | |

(52) U.S. Cl.
CPC .......... *G11C 11/419* (2013.01); *G06F 1/3275* (2013.01); *G11C 11/418* (2013.01); *G11C 8/08* (2013.01); *Y02D 10/14* (2018.01)

(58) Field of Classification Search
None
See application file for complete search history.

(56) References Cited

U.S. PATENT DOCUMENTS

| | | | |
|---|---|---|---|
| 5,438,542 A * | 8/1995 | Atsumi ................. | G11C 16/08 257/314 |
| 6,226,212 B1 * | 5/2001 | Sakamoto ............. | G11C 7/065 365/206 |
| 7,079,426 B2 | 7/2006 | Zhang et al. | |
| 7,099,197 B2 | 8/2006 | Satomi et al. | |
| 7,450,429 B2 | 11/2008 | Daga | |
| 7,505,345 B2 | 3/2009 | Wang et al. | |

(Continued)

*Primary Examiner* — Harry W Byrne
*Assistant Examiner* — Sultana Begum
(74) *Attorney, Agent, or Firm* — Sughrue Mion, PLLC

(57) ABSTRACT

An integrated circuit (IC) and a mobile device are provided. The IC includes a memory cell that includes a word line, a bit line pair, and a storage cell connected to the word line and the bit line pair. The IC further includes a timing control circuit configured to generate switch signals based on an operation control signal, and a switch circuit configured to receive a first voltage, a second voltage and a third voltage having different levels, and output, to the word line, one among the first voltage, the second voltage, and the third voltage based on the switch signals.

15 Claims, 6 Drawing Sheets

(56) References Cited

U.S. PATENT DOCUMENTS

| | | |
|---|---|---|
| 7,558,145 B2 | 7/2009 | Rao et al. |
| 8,139,426 B2 | 3/2012 | Park et al. |
| 8,630,132 B2 | 1/2014 | Cheng et al. |
| 8,630,139 B2 | 1/2014 | Braceras et al. |
| 8,724,421 B2 | 5/2014 | Evans et al. |
| 8,971,097 B2 | 3/2015 | Ngo et al. |
| 2010/0124098 A1* | 5/2010 | Zhang .................... G11C 5/063 365/154 |
| 2012/0307574 A1* | 12/2012 | Cheng ................... G11C 11/419 365/189.14 |
| 2014/0098612 A1* | 4/2014 | Hosono ............. G11C 16/3427 365/185.17 |
| 2015/0194190 A1 | 7/2015 | Liaw |
| 2015/0365075 A1* | 12/2015 | Kawa ............... H03K 19/00384 327/210 |
| 2015/0380077 A1* | 12/2015 | Wu ....................... G11C 11/419 365/154 |
| 2017/0032835 A1* | 2/2017 | Liaw .................... G11C 11/419 |

* cited by examiner

INTEGRATED CIRCUIT INCLUDING EMBEDDED MEMORY DEVICE FOR PERFORMING DUAL-TRANSIENT WORD LINE ASSIST USING TRIPLE POWER SOURCE AND DEVICE HAVING THE SAME

CROSS-REFERENCE TO RELATED APPLICATIONS

This application claims priority from U.S. Provisional Patent Application No. 62/272,977, filed on Dec. 30, 2015, and from Korean Patent Application No. 10-2016-0041388 filed on Apr. 5, 2016, the disclosures of which are incorporated herein by reference in their entireties.

BACKGROUND

1. Field

Apparatuses consistent with example embodiments relate to an integrated circuit (IC), and more particularly to an IC including an embedded memory device for performing a dual-transient word line assist using a triple power source and a device having the IC.

2. Description of Related Art

A minimum voltage of a static random access memory (SRAM) may be lowered to make a low power-high efficiency application processor. However, a degree of integration of a semiconductor circuit is further refined in a latest process, and thus parasitic components tend to be increased in the semiconductor circuit. Because a supply voltage supplied to the SRAM is gradually scaled down (or reduced), an SRAM of good quality becomes difficult to design. In addition, due to quantized width processing characteristics of a fin field effect transistor (FinFET), a bit cell of an SRAM having an optimum performance becomes difficult to develop. For this reason, a design of an assist circuit is a factor in designing a low power and high efficiency SRAM.

SUMMARY

According to example embodiments, an integrated circuit (IC) includes a memory cell that includes a word line, a bit line pair, and a storage cell connected to the word line and the bit line pair. The IC further includes a timing control circuit configured to generate switch signals based on an operation control signal, and a switch circuit configured to receive a first voltage, a second voltage and a third voltage having different levels, and output, to the word line, one among the first voltage, the second voltage, and the third voltage based on the switch signals.

According to example embodiments, an IC includes an embedded memory device including a word line, a bit line pair, and a storage cell connected to the word line and the bit line pair. The IC further includes a timing control circuit configured to generate switch signals based on an operation control signal, and a switch circuit configured to receive a first voltage, a second voltage, and a third voltage having different levels, and output, to the word line, one among the first voltage, the second voltage, and the third voltage based on the switch signals.

According to example embodiments, a mobile device includes an application processor, and a power management integrated circuit configured to supply a first voltage, a second voltage, and a third voltage to the application processor. The application processor includes an embedded memory device including a word line, a bit line pair, and a storage cell connected to the word line and the bit line pair. The application processor further includes a timing control circuit configured to generate switch signals based on an operation control signal, and a switch circuit configured to receive a first voltage, a second voltage, and a third voltage having different levels, and output, to the word line, one among the first voltage, the second voltage, and the third voltage based on the switch signals.

According to example embodiments, an IC includes a memory cell that includes a word line, a bit line pair, and a storage cell connected to the word line and the bit line pair. The IC further includes a timing control circuit configured to generate first switch signals based on an operation control signal instructing a normal operation, second switch signals based on the operation control signal instructing an assist operation, and third switch signals after the generation of the second switch signals. The IC further includes a switch circuit configured to receive a first voltage, a second voltage and a third voltage having different levels, output the first voltage to the word line based on the first switch signals, output the second voltage to the word line based on the second switch signals, and output the third voltage to the word line based on the third switch signals.

DETAILED DESCRIPTION OF THE EXAMPLE EMBODIMENTS

Figure 1:
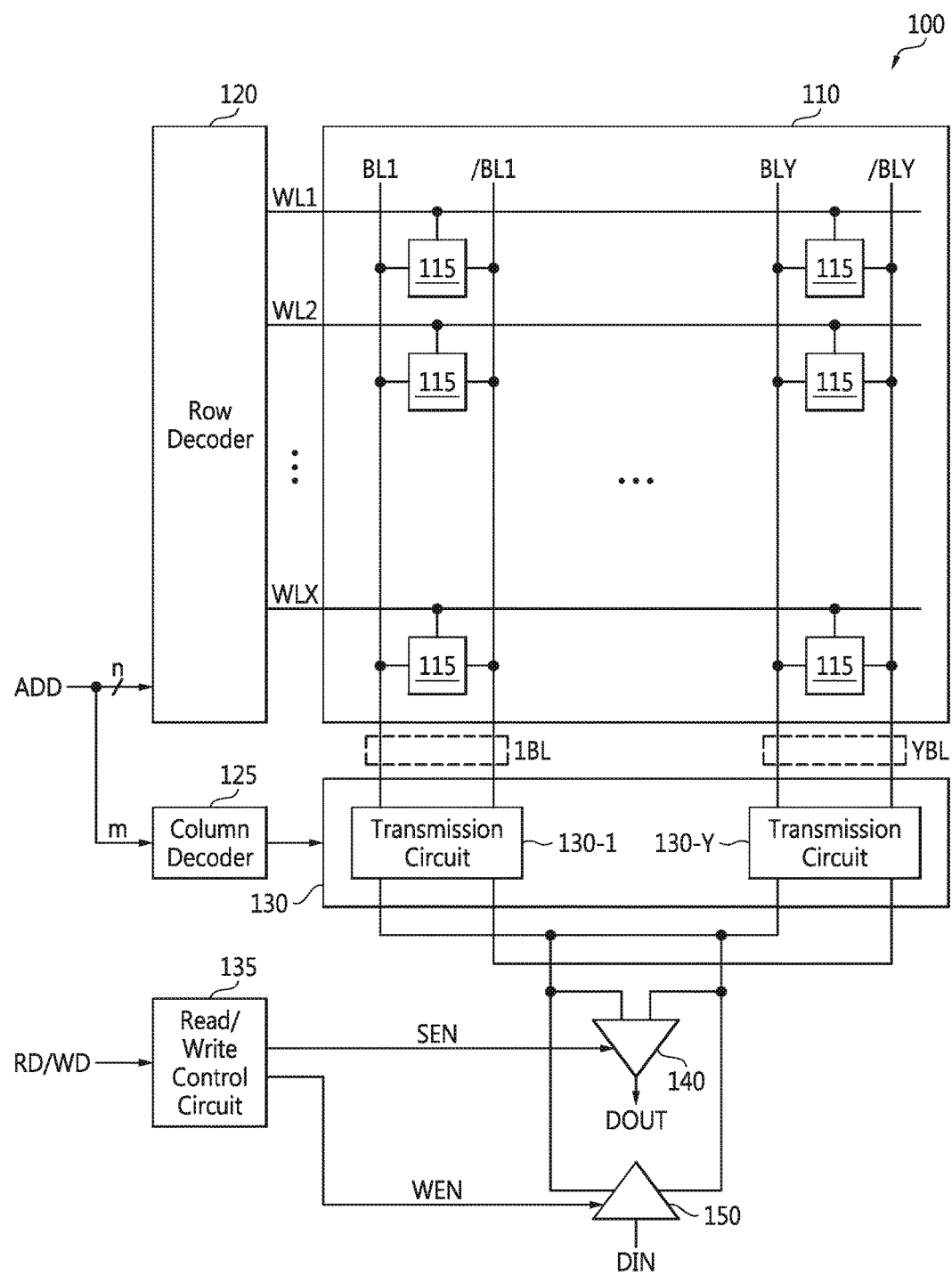
FIG. 1 is a circuit block diagram of an embedded memory device according to example embodiments.
Figure 2:
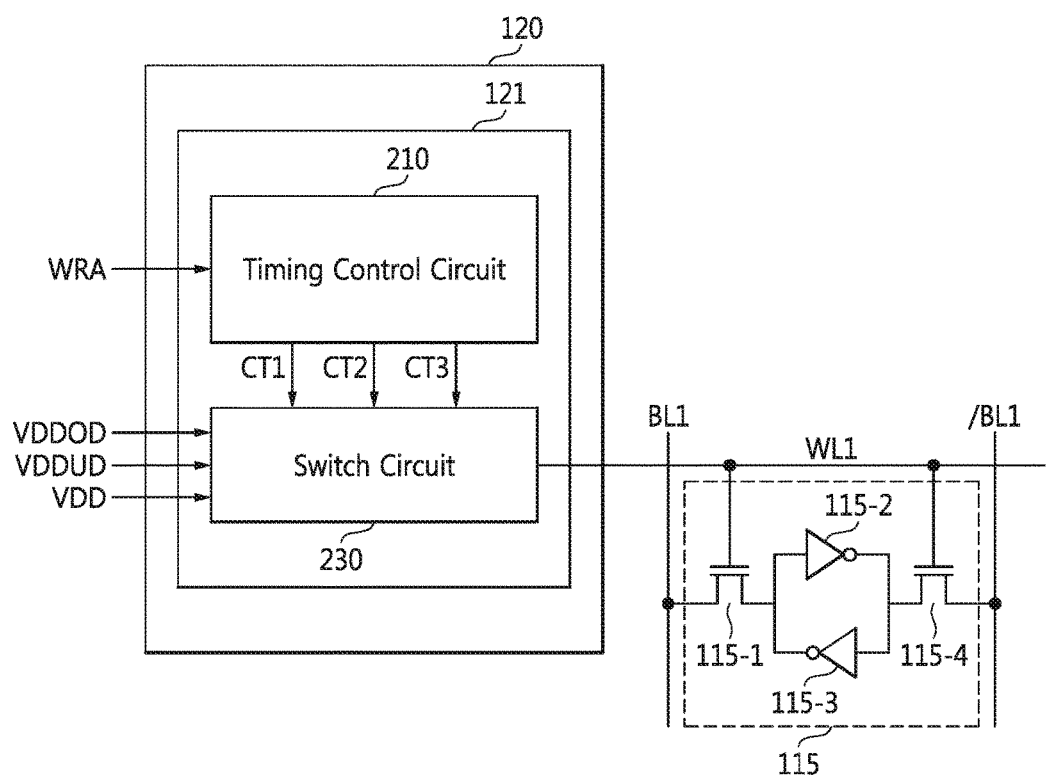
FIG. 2 is a circuit block diagram of a control circuit for controlling a dual-transient word line assist using a triple power source and a memory cell including a word line, according to example embodiments.

FIG. 1 is a circuit block diagram of an embedded memory device according to example embodiments. FIG. 2 is a circuit block diagram of a control circuit for controlling a dual-transient word line assist using a triple power source and a memory cell including a word line, according to example embodiments. Referring to FIG. 1, a memory device 100 embedded in an integrated circuit (IC) includes a memory cell array 110, a row decoder 120, a column decoder 125, a selection circuit block 130, a read/write control circuit 135, a sense amplifier 140, and a write driver 150.

The IC may mean an application specific integrated circuit (ASIC), a field-programmable gate array (FPGA), a system on chip (SoC), a large-scale integration (LSI), a processor, an application processor (AP), or a mobile AP.

The memory cell array 110 includes a plurality of word lines WL1 to WLX, where X is a natural number of three or more, a plurality of bit line pairs 1BL to YBL, where Y is a natural number of two or more, and a plurality of memory cells 115 each connected to a corresponding word line and a corresponding bit line pair. A bit line pair 1BL is defined as complementary bit lines BL1 and /BL1, and a bit line pair YBL is defined as complementary bit lines BLY and /BLY. The memory cell array 110 may be a fin field effect transistor (FinFET)-based static random access memory (SRAM) device.

For example, as shown in FIG. 2, one memory cell 115, for example, a SRAM memory cell, may include six metal-oxide-semiconductor field-effect transistors (MOSFETs). Each bit in the memory cell 115 may be stored in four MOSFETs forming two cross-coupled inverters 115-2 and 115-3. A storage cell formed by two cross-coupled inverters 115-2 and 115-3 has two stable states used to represent 0 and 1. Two access MOSFETs 115-1 and 115-4 may control an access (or an access operation) to the storage cell during a read operation and a write operation. The memory cell 115 may be referred to as a 6T bit cell. According to example embodiments, the memory cell 115 may be embodied using K-MOSFETs, and the K may be 4, 8, or another natural number.

Referring again to FIG. 1, the row decoder 120 may decode n bit-input addresses ADD and perform an operation of selecting one among the plurality of word lines WL1 to WLX according to a result of the decoding.

The column decoder 125 may decode m-bit input addresses ADD and perform an operation of selecting one among the plurality of bit line pairs 1BL to YBL according to a result of the decoding. Accordingly, one among the plurality of memory cells 115 may be selected according to an operation of the row decoder 120 and an operation of the column decoder 125.

The selection circuit block 130 includes a plurality of transmission circuits 130-1 and 130-Y, and each of the transmission circuits 130-1 and 130-Y may control a connection between each bit line pair and the sense amplifier 140 or a connection between each bit line pair and the write driver 150 according to a result of decoding by the column decoder 125.

The read/write control circuit 135 may generate a sense amplifier enable signal SEN in response to a read command RD for a read operation. The read/write control circuit 135 may generate a driver enable signal WEN in response to a write command WD for a write operation.

During a read operation, the sense amplifier 140 may be enabled in response to the sense amplifier enable signal SEN, and the enabled sense amplifier 140 may sense and amplify data output from a selected bit line pair through a selected transmission circuit, and generate output data DOUT.

During a write operation, the write driver 150 may be enabled in response to the driver enable signal WEN, and the enabled write driver 150 may transmit input data DIN to a selected bit line pair through a selected transmission circuit.

FIG. 2 is a circuit block diagram of a control circuit for controlling a dual-transient word line assist using a triple power source and a memory cell including a word line, according to example embodiments. FIG. 2 shows a control circuit 121 for supplying one among a first voltage VDD, a second voltage VDDUD, and a third voltage VDDOD to a word line WL1, the control circuit 121 being embodied in the row decoder 120; however, the control circuit 121 may be embodied outside of the row decoder 120.

The control circuit 121 includes a timing control circuit 210 and a switch circuit 230. The timing control circuit 210 may generate switch control signals CT1, CT2, and CT3 in response to an operation control signal WRA. The operation control signal WRA may instruct (or indicate) a normal operation or an assist operation.

The switch circuit 230 may receive the first voltage VDD, the second voltage VDDUD, and the third voltage VDDOD having different levels (or voltage levels), and output one among the first voltage VDD, the second voltage VDDUD and the third voltage VDDOD to the word line WL1 in response to the switch control signals CT1, CT2, and CT3. For example, the first voltage VDD may be supplied as an operation voltage of a storage cell formed by two cross-coupled inverters 115-2 and 115-3.

During a normal operation (for example, an operation without a write assist or a read assist), the first voltage VDD that is a normal voltage may be supplied to the word line WL1 of the memory cell 115. However, when an assist operation, i.e., a dual-transient word line (DTWL) assist operation, is performed, the second voltage VDDUD may be supplied to the word line WL1 at the beginning or initially, and the third voltage VDDOD may be automatically supplied to the word line WL1 continuously or consecutively after a time elapses.

For example, the second voltage VDDUD and the third voltage VDDOD may be continuously supplied to a corresponding word line during one cycle of an external clock signal or an internal clock signal generated based on the external clock signal. According to example embodiments, the external clock signal may be the same as or different from the internal clock signal in frequency. The timing control circuit 210 may be referred to as a DTWL controller.

Figure 3:
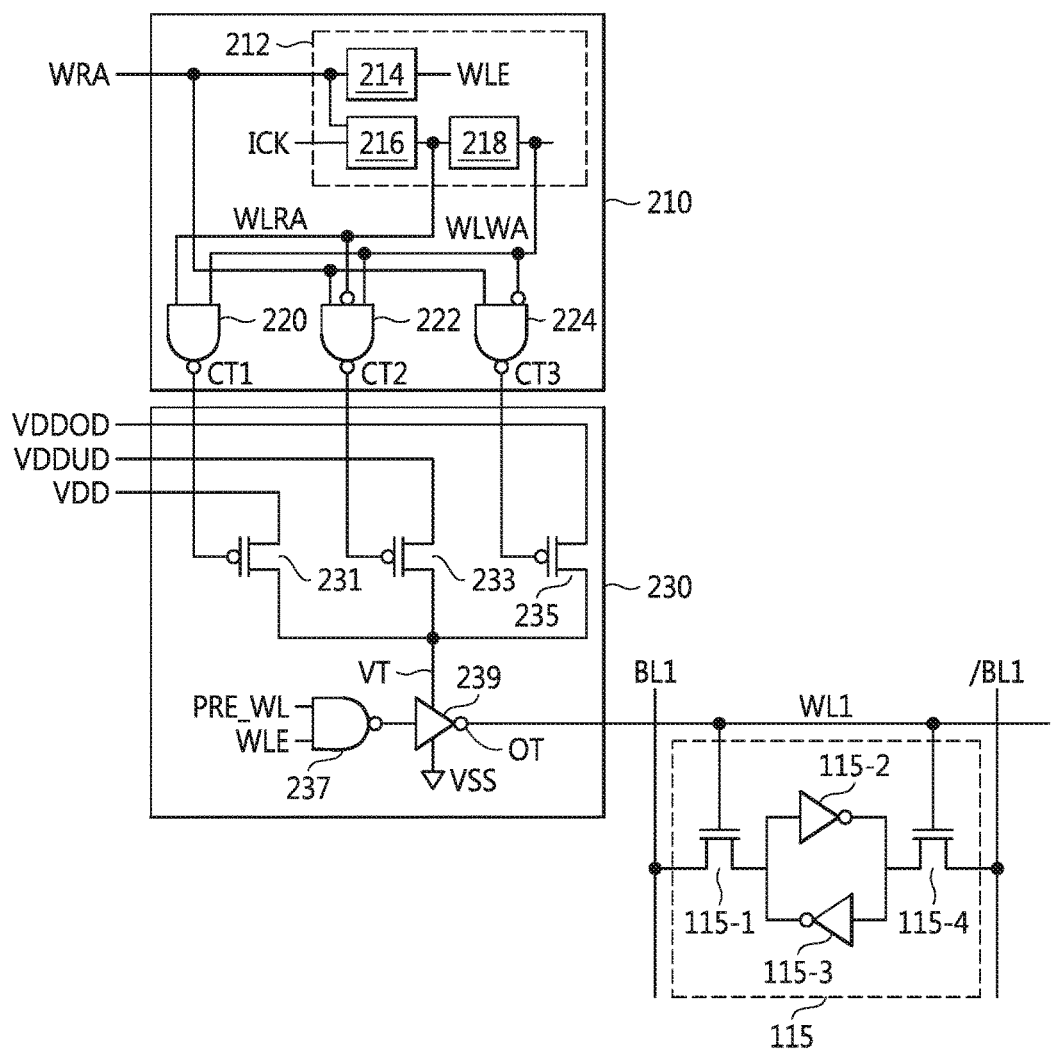
FIG. 3 is a circuit diagram of the control circuit shown in FIG. 2.
Figure 4:
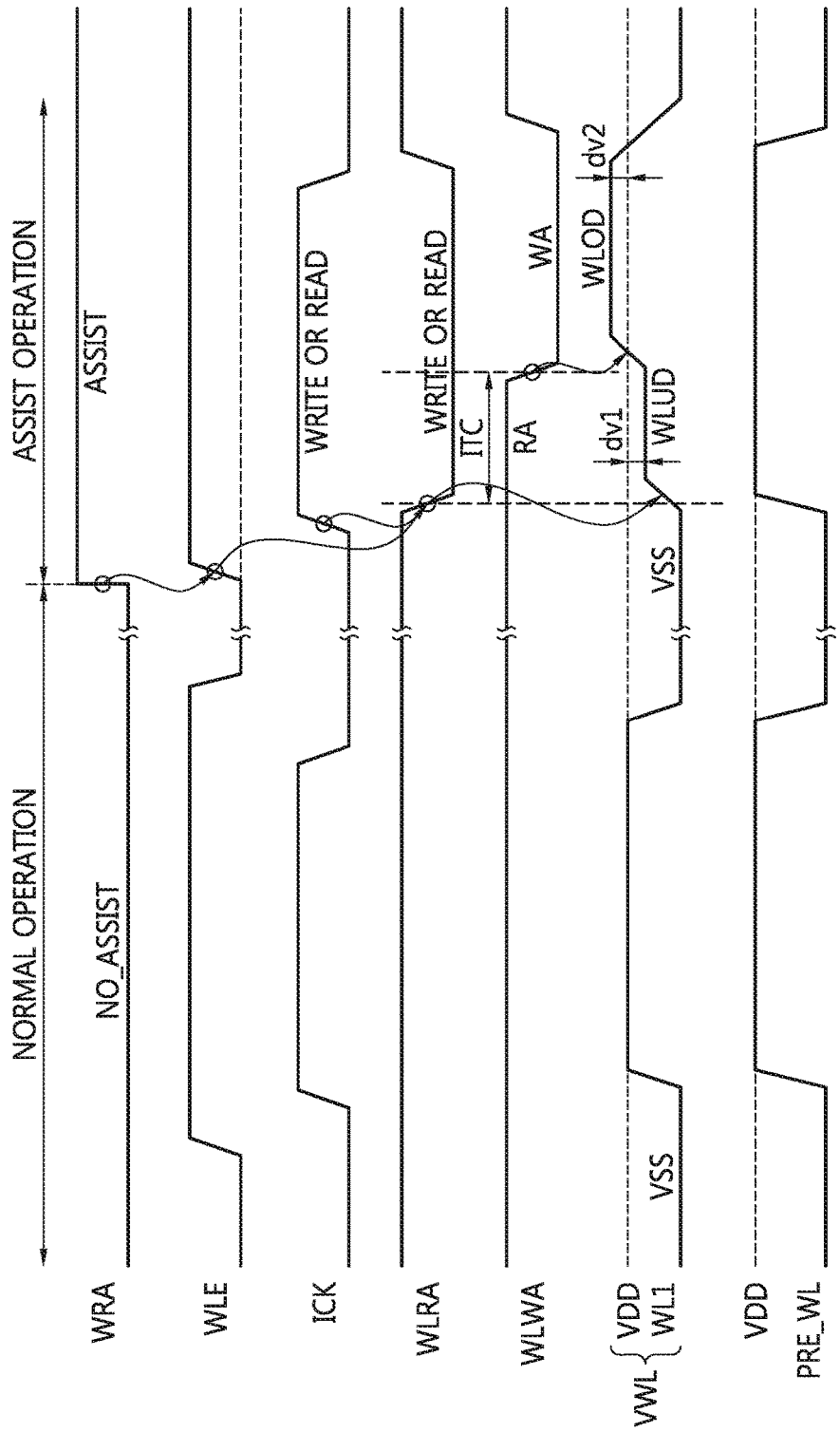
FIG. 4 is a timing diagram illustrating an operation of the control circuit shown in FIG. 3.

FIG. 3 is a circuit diagram of the control circuit shown in FIG. 2, and FIG. 4 is a timing diagram illustrating an operation of the control circuit shown in FIG. 3. Referring to FIGS. 2 and 3, the timing control circuit 210 includes a pulse generator 212 and a plurality of switch signal generators 220, 222, and 224.

The pulse generator 212 includes a word line enable signal generator 214, a read assist signal generator 216, and a write assist signal generator 218.

The word line enable signal generator 214 may generate a word line enable signal WLE having a waveform shown in FIG. 4 in response to the operation control signal WRA.

The read assist signal generator 216 may generate a word line read assist signal WLRA having a waveform exemplarily shown in FIG. 4 in response to an internal clock signal ICK, and the write assist signal generator 218 may generate a word line write assist signal WLWA having a waveform exemplarily shown in FIG. 4 using the word line read assist signal WLRA.

A first switch signal generator 220 may generate a first switch signal CT1 using the word linen read assist signal WLRA and the word line write assist signal WLWA.

A second switch signal generator 222 may generate a second switch signal CT2 using the operation control signal WRA, the word line read assist signal WLRA, and the word line write assist signal WLWA.

A third switch signal generator 224 may generate a third switch signal CT3 using the operation control signal WRA and the word line write assist signal WLWA.

For example, each of the switch signal generators 220, 222, and 224 may be embodied as a NAND gate; however, a structure of each of the switch signal generators 220, 222, and 224 may be modified as various forms to be suitable for a waveform of a word line voltage VWL supplied to the word line WL1 shown in FIG. 4.

Referring to FIGS. 2 and 3, the switch circuit 230 includes a first switch 231, a second switch 233, a third switch 235, a NAND gate 237, and an inverter 239.

Although the inverter 239 is embodied in the switch circuit 230 in FIGS. 2 and 3, the inverter 239 may be embodied outside of the switch circuit 230. The inverter 239 may be referred to as a driver for driving the word line WL1.

Triple power sources (or the voltages VDD, VDDUD, and VDDOD) are supplied to the switch circuit 230. The first switch 231 controls a supply of the first voltage VDD to a voltage node VT of the inverter 239 in response to the first switch signal CT1. The second switch 233 controls a supply of the second voltage VDDUD to the voltage node VT of the inverter 239 in response to the second switch signal CT2, and the third switch 235 controls a supply of the third voltage VDDOD to the voltage node VT of the inverter 239 in response to the third switch signal CT3. Each of the switches 231, 233, and 235 may be embodied as a P-type MOSFET.

The NAND gate 237 performs a NAND operation on a pre-word line signal PRE_WL (as also shown in FIG. 4) and the word line enable signal WLE, and outputs a result of the NAND operation to the inverter 239.

The inverter 239 includes an output terminal OT connected to the word line WL1 and includes the voltage node VT connected to an output terminal of each of the switches 231, 233, and 235. Accordingly, the inverter 239 may supply a voltage VDD (as also shown in FIG. 4), VDDUD, or VDDOD supplied to the voltage node VT or a ground voltage VSS to the word line WL1 of the memory cell 115 through the output terminal OT. For example, when an output signal of the NAND gate 237 is at a high level (or data 1), the word line voltage VWL of the word line WL1 is the ground voltage VSS, and when the output signal of the NAND gate 237 is at a low level (or data 0), the word line voltage VWL of the word line WL1 is a voltage VDD, VDDUD, or VDDOD supplied to the voltage node VT.

Figure 5:
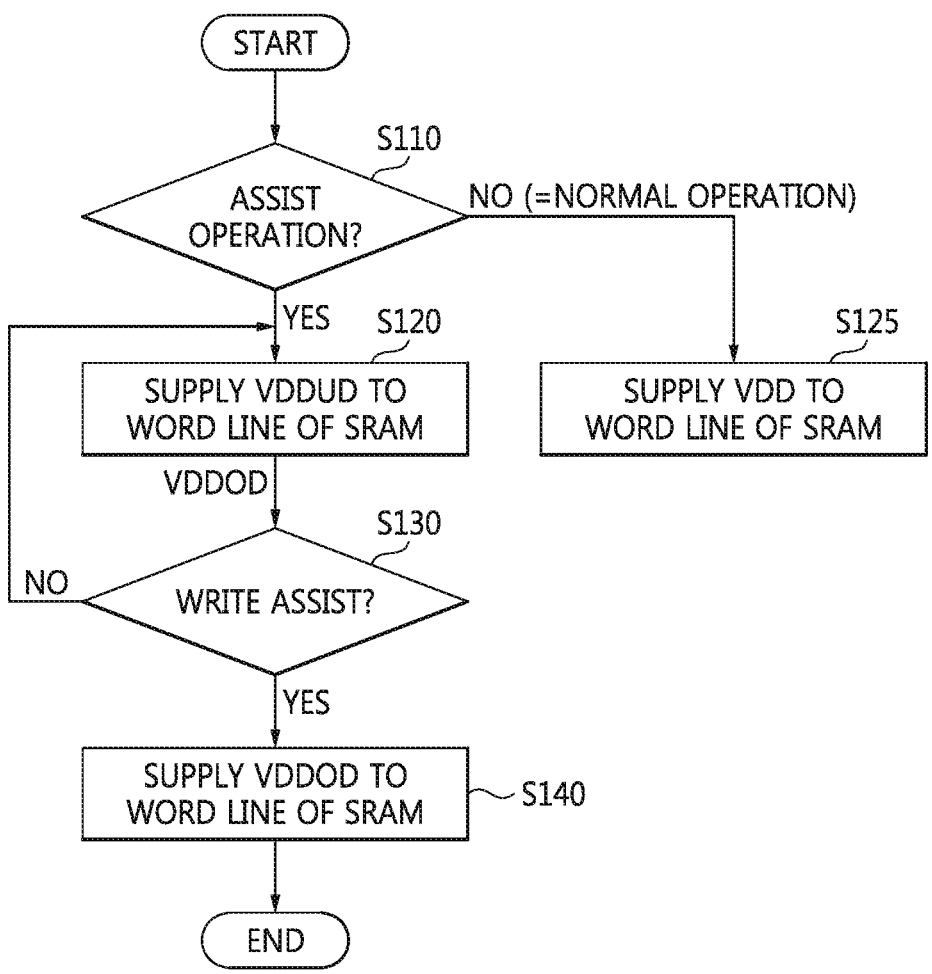
FIG. 5 is a flowchart illustrating the operation of the control circuit shown in FIG. 3.

FIG. 5 is a flowchart illustrating the operation of the control circuit shown in FIG. 3. An operation of the control circuit 121 is described referring to FIGS. 3 to 5.

When an operation mode of the memory device 100 embedded in the IC is a normal operation mode NORMAL OPERATION or NO_ASSIST (NO in S110), that is, when the operation control signal WRA is at the low level, both the word line read assist signal WLRA and the word line write assist signal WLWA are at the high level.

The first switch signal generator 220 outputs the first switch signal CT1 having the low level, the second switch signal generator 222 outputs the second switch signal CT2 having the high level, and the third switch signal generator 224 outputs the third switch signal CT3 having the high level. The first switch 231 is only turned on in response to the first switch signal CT1 having the low level, and thus the first voltage VDD is supplied to the voltage node VT of the inverter 239.

When both the word line enable signal WLE and the pre-word line signal PRE_WL are at the high level, the NAND gate 237 outputs the output signal having the low level. Accordingly, the inverter 239 supplies the first voltage VDD to the word line WL1 (S125). However, when both the word line enable signal WLE and the pre-word line signal PRE_WL are not at the high level, the NAND gate 237 outputs the output signal having the high level. Accordingly, the inverter 239 supplies the ground voltage VSS to the word line WL1.

When an operation mode of the memory device 100 embedded in the IC is an assist operation mode ASSIST OPERATION or ASSIST (YES in S110), that is, when the operation control signal WRA is at the high level, the word line enable signal WLE transitions to the high level. Accordingly, the NAND gate 237 outputs the output signal having the low level to an input terminal of the inverter 239.

During an initial time ITC of the assist operation mode ASSIST OPERATION or ASSIST, that is, during a time for a read assist RA (YES in S110), the word line read assist signal WLRA is at the low level and the word line write assist signal WLWA is at the high level.

As the word line read assist signal WLRA transitions from the high level to the low level, the second voltage VDDUD is supplied to the voltage node VT of the inverter 239. When both the word line enable signal WLE and the pre-word line signal PRE_WL are at the high level, the NAND gate 237 outputs the output signal having the low level. Accordingly, the inverter 239 supplies the second voltage VDDUD to the word line WL1 of the memory cell 115 in response to an input signal having the low level (S120). The second voltage VDDUD is supplied to the word line WL1 for the read assist RA. A difference between the first voltage VDD and the second voltage VDDUD is dv1.

The control circuit 121 supplies the second voltage VDDUD lower than the first voltage VDD to the word line WL1 for a word line under-driving (WLUD) scheme (S120).

For example, in the assist operation mode ASSIST OPERATION or ASSIST during the initial time ITC, the first switch signal generator 220 outputs the first switch signal CT1 having the high level, the second switch signal generator 222 outputs the second switch signal CT2 having the low level, and the third switch signal generator 224 outputs the third switch signal CT3 having the high level. During the initial time ITC, each of the switches 231 and 235 is turned off in response to each of the plurality of switch signals CT1 and CT3 having the high level, and only the second switch 233 is turned on in response to the second switch signal CT2 having the low level. As a result, the inverter 239 supplies the second voltage VDDUD supplied to the voltage node VT to the word line WL1 of the memory cell 115 in response to the input signal having the low level.

The write assist signal generator 218 generates the word line write assist signal WLWA transitioning from the high level to the low level after a period of time, i.e., the initial time ITC, elapses (YES in S130). The write assist signal generator 218 may be referred to as an internal-timing-control circuit. The internal-timing-control circuit may be set after all memory cells are tested for the read assist and the write assist in a SRAM macro.

After a delay (for example, a timing span or the initial time ITC) determined by the internal-timing-control circuit elapses, the word line write assist signal WLWA transitions from the high level to the low level for a write assist WA (S130).

As the word line write assist signal WLWA transitions from the high level to the low level, the third voltage VDDOD is supplied to the voltage node VT of the inverter 239. In detail, when both the word line enable signal WLE and the pre-word line signal PRE_WL are at the high level, the NAND gate 237 outputs the output signal having the low level. As a result, the inverter 239 supplies the third voltage VDDOD to the word line WL1 of the memory cell 115 in response to the input signal having the low level (S140). The third voltage VDDOD is supplied to the word line WL1 for the write assist WA. A difference between the third voltage VDDOD and the first voltage VDD is dv2. The dv1 and the dv2 may be different from each other, and the dv2 may be greater than the dv1.

The control circuit 121 supplies the third voltage VDDOD higher than the first voltage VDD to the word line WL1 for a word line over-driving (WLOD) scheme (S140).

For example, during the write assist WA, the first switch signal generator 220 outputs the first switch signal CT1 having the high level, the second switch signal generator 222 outputs the second switch signal CT2 having the high level, and the third switch signal generator 224 outputs the third switch signal CT3 having the low level. During the write assist WA, each of the switches 231 and 233 is turned off in response to each of the plurality of switch signals CT1 and CT2 having the high level, and only the third switch 235 is turned on in response to the third switch signal CT3 having the low level. Accordingly, the inverter 239 supplies the third voltage VDDOD supplied to the voltage node VT to the word line WL1 of the memory cell 115 in response to the input signal having the low level. The embedded memory device, e.g., the SRAM, may use three voltages, that is, the first voltage VDD, the second voltage VDDUD (=VDD−dv1), and the third voltage VDDOD (=VDD+dv2).

Figure 6:
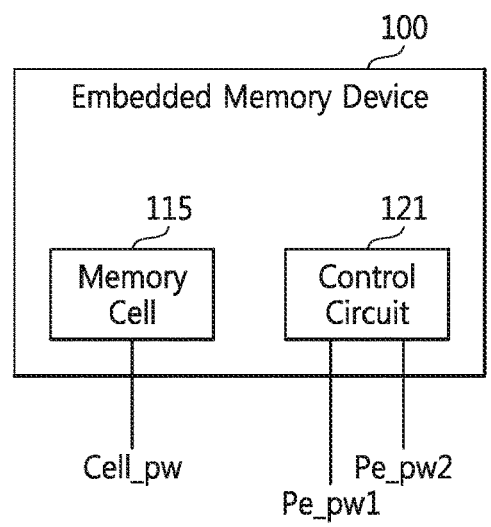
FIG. 6 is a block diagram of triple-power sources used in an embedded memory device according to example embodiments.

FIG. 6 is a block diagram of triple-power sources used in an embedded memory device according to example embodiments. The embedded memory device 100 may use triple power sources (Cell_pw=VDD, Pe_pw1=VDDUD, and Pe_pw2=VDDOD). For example, the memory cell 115 may use the power source Cell_pw, and the control circuit 121 or any other peripheral circuit may use the power sources Pe_pw1 and Pe_pw2.

Figure 7:
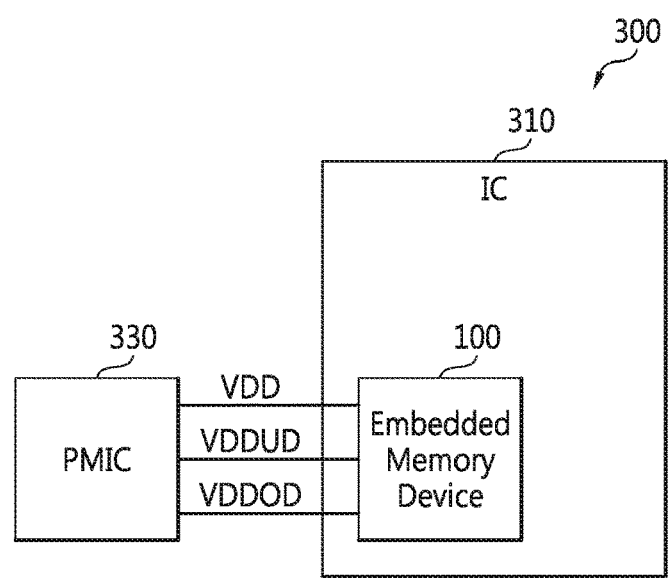
FIG. 7 is a block diagram of a mobile device that includes an integrated circuit including an embedded memory device according to example embodiments.

FIG. 7 is a block diagram of a mobile device that includes an integrated circuit including an embedded memory device according to example embodiments. Referring to FIGS. 1 to 7, a mobile device 300 includes an IC 310 including the embedded memory device 100, and a power management IC (PMIC) 330. As described above, the IC 310 may include a SoC, an ASIC, a FPGA, an LSI, a processor, an AP, or a mobile AP.

The mobile device 300 may be embodied as a laptop computer, a mobile phone, a smart phone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID), a wearable computer, an Internet of Things (IoT) device, an Internet of Everything (IoE) device, a drone, or an e-book.

The embedded memory device 100 using the triple power sources VDD, VDDUD, and VDDOD uses the triple power sources VDD, VDDUD, and VDDOD from the PMIC 330, and does not require an additional circuit (for example, when a memory device uses a single power source or dual power sources, the additional circuit such as a level shifter is embodied in the memory device), thereby reducing overhead of the additional circuit. Moreover, even if the IC 310 includes a plurality of embedded memory devices, the plurality of embedded memory devices may use the triple power sources VDD, VDDUD, and VDDOD supplied from the PMIC 330 in common.

As described referring to FIGS. 1 to 7, the second voltage VDDUD and the third voltage VDDOD are supplied to the word line WL1 one after another in one cycle of an external clock signal or the internal clock signal ICK related to the external clock signal, and thereby a disturb margin, e.g., a hold margin of half-selected cells, is improved and a write ability is also improved. For example, the control circuit 121 may function as a read assist circuit and a write assist circuit.

An embedded memory device according to example embodiments uses triple power sources (triple powers or three voltages) unlike a conventional memory device. A control circuit embodied in the embedded memory device supplies a first voltage VDD to a word line WL1 of a memory cell during a normal operation, and supplies a second voltage VDDUD and a third voltage VDDOD to the word line WL1 of the memory cell one after another in one clock cycle during a DTWL assist operation for a read assists RA and a write assist WA. Accordingly, the read assist RA and the write assist WA may be embodied at the same time.

A memory device embedded in an IC according to example embodiments can perform a WLUD scheme for improving read stability by lowering a voltage level of a word line of the embedded memory device, and a WLOD scheme for improving a write ability by increasing a voltage level of the word line in one clock cycle one after another.

The embedded memory device may use triple power sources (or voltages), one among the triple power sources may be used for a storage cell of the memory device, and remaining two of the triple power sources may be used for a peripheral circuit.

A conventional memory device using a single power source or dual-power sources includes an additional level shifter, but the embedded memory device using the triple power sources does not need to include an additional level shifter unlike the conventional memory device. That is, the embedded memory device may utilize the triple power sources output from a power management IC as power sources of memory cells included in the embedded memory device as they are. Accordingly, the embedded memory device can reduce overhead of the additional level shifter.

The embedded memory device can supply a voltage for the WLUD scheme to a word line at the beginning in one clock cycle in an operation mode in which a dual-transient word line assist is performed, and automatically supply a voltage for the WLOD scheme to the word line after a period of time elapses.

The read stability of half-selected cells is increased as the voltage for the WLOD scheme is supplied to the word line at the beginning, and the write ability is increased as the voltage for the WLOD scheme is supplied to the word line after a period of time elapses.

As is traditional in the field of the inventive concepts, example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the example embodiments may be physically separated into two or more interacting and discrete blocks, units and/or modules without departing from the scope of the inventive concepts. Further, the blocks, units and/or modules of the example embodiments may be physically combined into more complex blocks, units and/or modules without departing from the scope of the inventive concepts.

Although a few example embodiments of the inventive concept have been shown and described, it will be appreciated by those skilled in the art that changes may be made in these example embodiments without departing from the principles and spirit of the inventive concept, the scope of which is defined in the appended claims and their equivalents.

What is claimed is:

1. An integrated circuit (IC) comprising a memory cell that comprises a word line, a bit line pair, and a storage cell connected to the word line and the bit line pair, the IC further comprising:
    a timing control circuit configured to generate a first switch signal, a second switch signal, and a third switch signal, based on an operation control signal; and
    a switch circuit comprising:
        a driver;
        a first switch comprising a first terminal configured to receive a first voltage, a first gate configured to receive the first switch signal, and a second terminal configured to output, to the driver, the first voltage as an operation voltage of the driver, based on the first switch signal;
        a second switch comprising a third terminal configured to receive a second voltage, a second gate configured to receive the second switch signal, and a fourth terminal configured to output, to the driver, the second voltage as the operation voltage of the driver, based on the second switch signal; and
        a third switch comprising a fifth terminal configured to receive a third voltage, third gate configured to receive the third switch signal, and a sixth terminal configured to output, to the driver, the third voltage as the operation voltage of the driver, based on the third switch signal,
        wherein the first voltage, the second voltage and the third voltage have different levels,
        wherein the first voltage is for a normal read or write operation of the memory cell, the second voltage is for a read assist operation of the memory cell, and the third voltage for a write assist operation of the memory cell, and
        wherein the driver is configured to output, to the word line, the first voltage, the second voltage, and the third voltage that is outputted as the operation voltage of the driver.

2. The IC of claim 1, wherein the driver is configured to output the first voltage to the word line, based on the first switch signal being generated in response to the operation control signal instructing the normal read or write operation,
    wherein the driver is further configured to output the second voltage to the word line, based on the second switch signal being generated in response to the operation control signal instructing the read assist operation,
    wherein the driver is further configured to output the third voltage to the word line after the second voltage is output to the word line, based on the third switch signal being generated in response to the operation control signal instructing the write assist operation after the read assist operation is instructed, and
    wherein the first voltage is greater than the second voltage and less than the third voltage.

3. The IC of claim 1, wherein the second voltage and the third voltage are output to the word line one after another in one cycle of an internal clock signal.

4. The IC of claim 1, wherein the timing control circuit comprises:
    a read assist signal generator configured to generate a read assist signal, based on the operation control signal and an internal clock signal;
    a write assist signal generator configured to generate a write assist signal, based on the read assist signal;
    a first switch signal generator configured to generate the first switch signal, based on the read assist signal and the write assist signal;
    a second switch signal generator configured to generate the second switch signal, based on the operation control signal, the read assist signal, and the write assist signal; and
    a third switch signal generator configured to generate the third switch signal, based on the operation control signal and the write assist signal.

5. An integrated circuit (IC) comprising:
    an embedded memory device comprising a word line, a bit line pair, and a storage cell connected to the word line and the bit line pair;
    a timing control circuit configured to generate a first switch signal, a second switch signal, and a third switch signal, based on an operation control signal; and
    a switch circuit comprising:
        an inverter connected to a ground, and comprising a voltage supply terminal and an output terminal connected to the word line;
        a first switch comprising a first terminal configured to receive a first voltage, a first gate configured to receive the first switch signal, and a second terminal configured to output, to the voltage supply terminal, the first voltage as an operation voltage of the inverter, based on the first switch signal;
        a second switch comprising a third terminal configured to receive a second voltage, a second gate configured to receive the second switch signal, and a fourth terminal configured to output, to the voltage supply terminal, the second voltage as the operation voltage of the inverter, based on the second switch signal; and
        a third switch comprising a fifth terminal configured to receive a third voltage, a third gate configured to receive the third switch signal, and a sixth terminal configured to output, to the voltage supply terminal, the third voltage as the operation voltage of the inverter, based on the third switch signal,
        wherein the first voltage, the second voltage and the third voltage have different levels, and
        wherein the inverter is configured to:
            output the first voltage to the word line, based on the first switch signal being generated in response to the operation control signal instructing a normal read or write operation;
            output the second voltage to the word line, based on the second switch signal being generated in response to the operation control signal instructing a read assist operation; and
            output the third voltage to the word line after the second voltage is output to the word line, based on the third switch signal being generated in response to the operation control signal instructing a write assist operation.

6. The IC of claim 5, wherein the first voltage is greater than the second voltage and less than the third voltage.

7. The IC of claim 5, wherein the second voltage and the third voltage are output to the word line in one cycle of an internal clock signal.

8. The IC of claim 5, wherein the timing control circuit is further configured to control a timing of a transition of any one or any combination the first switch signal, the second switch signal and the third switch signal, to adjust times at which the second voltage and the third voltage are respectively output to the word line.

9. The IC of claim 5, wherein a first difference between the first voltage and the second voltage is different from a second difference between the first voltage and the third voltage.

10. The IC of claim 5, wherein a first difference between the first voltage and the third voltage is greater than a second difference between the first voltage and the second voltage.

11. The IC of claim 5, wherein the embedded memory device is a fin field effect transistor (FinFET)-based static random access memory (SRAM).

12. The IC of claim 5, wherein the timing control circuit comprises:
- a read assist signal generator configured to generate a read assist signal, based on the operation control signal and an internal clock signal;
- a write assist signal generator configured to generate a write assist signal, based on the read assist signal;
- a first switch signal generator configured to generate the first switch signal, based on the read assist signal and the write assist signal;
- a second switch signal generator configured to generate the second switch signal, based on the operation control signal, the read assist signal, and the write assist signal; and
- a third switch signal generator configured to generate the third switch signal, based on the operation control signal and the write assist signal.

13. A mobile device comprising:
an application processor, and
a power management integrated circuit configured to output a first voltage, a second voltage, and a third voltage, to the application processor,
wherein the application processor comprises:
- an embedded memory device comprising a word line, a bit line pair, and a storage cell connected to the word line and the bit line pair;
- a timing control circuit configured to generate a first switch signal, a second switch signal, and a third switch signal, based on an operation control signal, and
- a switch circuit comprising:
  - an inverter connected to a ground, and comprising a voltage supply terminal and an output terminal connected to the word line;
  - a first switch comprising a first terminal configured to receive the first voltage, a first gate configured to receive the first switch signal, and a second terminal configured to output, to the voltage supply terminal, the first voltage as an operation voltage of the inverter, based on the first switch signal;
  - a second switch comprising a third terminal configured to receive the second voltage, a second gate configured to receive the second switch signal, and a fourth terminal configured to output, to the voltage supply terminal, the second voltage as the operation voltage of the inverter, based on the second switch signal; and
  - a third switch comprising a fifth terminal configured to receive the third voltage, a third gate configured to receive the third switch signal, and a sixth terminal configured to output, to the voltage supply terminal, the third voltage as the operation voltage of the inverter, based on the third switch signal,
  wherein the first voltage, the second voltage and the third voltage have different levels, and
  wherein the inverter is configured to:
    - output the first voltage to the word line, based on the first switch signal being generated in response to the operation control signal instructing a normal read or write operation;
    - output the second voltage to the word line, based on the second switch signal being generated in response to the operation control signal instructing a read assist operation; and
    - output the third voltage to the word line after the second voltage is output to the word line, based on the third switch signal being generated in response to the operation control signal instructing a write assist operation.

14. The mobile device of claim 13, wherein the first voltage is greater than the second voltage and less than the third voltage.

15. The mobile device of claim 13, wherein the second voltage and the third voltage are output to the word line in one cycle of an internal clock signal.

* * * * *